(12) United States Patent
Hung et al.

(10) Patent No.: US 7,876,085 B2
(45) Date of Patent: Jan. 25, 2011

(54) QUASI-RESONANT VALLEY VOLTAGE DETECTING METHOD AND APPARATUS

(75) Inventors: Chia-Chieh Hung, Hsin-Chu (TW); Yen-Hui Wang, Hsin-Chu (TW)

(73) Assignee: Grenergy Opto, Inc., Hsin-Chu (TW)

( * ) Notice: Subject to any disclaimer, the term of this patent is extended or adjusted under 35 U.S.C. 154(b) by 57 days.

(21) Appl. No.: 12/482,358

(22) Filed: Jun. 10, 2009

(65) Prior Publication Data
US 2010/0315062 A1 Dec. 16, 2010

(51) Int. Cl.
*G01R 19/00* (2006.01)
(52) U.S. Cl. ...................................... 324/102
(58) Field of Classification Search .......... 324/765, 324/763, 760, 769, 158.1, 102; 257/48; 438/14–18; 318/114; 345/156, 161, 163; 327/65, 77, 327/89
See application file for complete search history.

(56) References Cited

U.S. PATENT DOCUMENTS 4,928,087 A * 5/1990 Kreft et al. ............... 340/10.34
6,548,971 B2 * 4/2003 Gokturk ..................... 318/114

* cited by examiner

*Primary Examiner*—Ha Tran T Nguyen
*Assistant Examiner*—Tung X Nguyen
(74) *Attorney, Agent, or Firm*—Apex Juris, PLLC; Tracy M Heims (57) ABSTRACT

The present invention discloses a quasi-resonant valley voltage detecting method, comprising the steps of: generating a valley detection signal by detecting a valley of a first quasi-resonant signal; generating a count value by counting the valley detection signal; and determining a level transition instance of a gating signal according to the count value, wherein the level transition instance of the gating signal is pulled back by the valley detection signal to trace the valley of the first quasi-resonant signal. The present invention also provides a quasi-resonant valley voltage detecting apparatus.

9 Claims, 13 Drawing Sheets

QUASI-RESONANT VALLEY VOLTAGE DETECTING METHOD AND APPARATUS

BACKGROUND OF THE INVENTION

1. Field of the Invention

The present invention relates to switching power conversions, and more particularly relates to switching power conversions capable of performing soft switching on a primary side power switch.

2. Description of the Related Art

To reduce the power dissipation, electromagnetic interference, etc. of the switching power converters, soft switching is widely adopted due to the advantage of low conduction loss of the primary side power switch.

Figure 1:
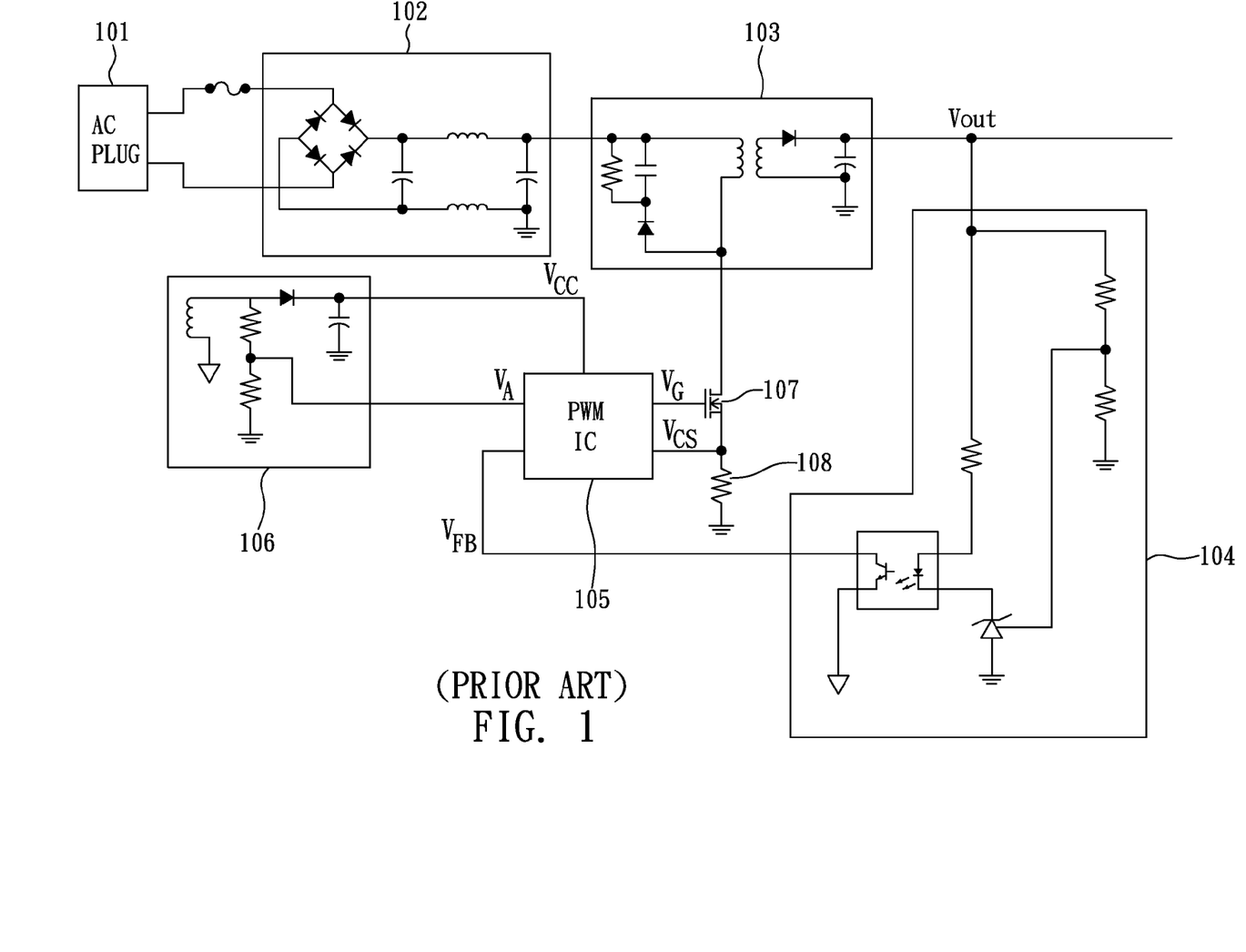
FIG. 1 is the circuit diagram of a typical fly-back AC-to-DC power adapter utilizing a soft switching scheme.

Taking the fly-back AC-to-DC power adapter using soft switching as an example, FIG. 1 shows the circuit diagram of a typical fly-back AC-to-DC power adapter. As shown in FIG. 1, the typical fly-back AC-to-DC power adapter includes an AC plug 101, an input rectification and filtering unit 102, a main transformer and output rectification and filtering unit 103, a feedback network 104, a PWM IC 105, a $V_{CC}$ regulator 106, an NMOS transistor 107 and a resistor 108.

In the architecture, the AC plug 101 is used for providing an AC input.

The input rectification and filtering unit 102 is used to generate a main input voltage according to the AC input.

The main transformer and output rectification and filtering unit 103, having a primary side coupled to the main input voltage and a secondary side coupled to a combination of a diode and a capacitor, is used to convert power from the AC input to the output $V_{out}$ of the adapter.

The feedback network 104 is used to generate a feedback signal $V_{FB}$ according to an error signal derived from a reference voltage and the output $V_{out}$.

The PWM IC 105 is used to generate a gating signal $V_G$ according to a quasi-resonant (QR) signal $V_A$, the feedback signal $V_{FB}$ and a current sensing signal $V_{CS}$ to drive the NMOS transistor 107, wherein the gating signal $V_G$ is expected to issue a high level at the instance when the quasi-resonant (QR) signal $V_A$ is at its valley voltage to reduce the conduction loss on the NMOS transistor 107.

The $V_{CC}$ regulator 106 is used to generate a DC supply voltage $V_{CC}$ and the quasi-resonant (Q) signal $V_A$ for the operation of the PWM IC 105, wherein the resonant waveform of the quasi-resonant (QR) signal $V_A$ is proportional to the drain voltage of the NMOS transistor 107 when the NMOS transistor 107 is off, and the valley of the quasi-resonant (QR) signal $V_A$ is corresponding to the valley of the drain voltage of the NMOS transistor 107.

The NMOS transistor 107, responsive to the gating signal $V_G$, is used to control the power conversion via the main transformer and output rectification and filtering unit 103.

The resistor 108 is used to carry the current sensing signal $V_{CS}$.

Through a periodic soft switching of the NMOS transistor 107, which is driven by the gating signal $V_G$ generated from the PWM IC 105, the input power is transformed through the main transformer and output rectification and filtering unit 103 to the output with less conduction loss on the NMOS transistor 107.

However, it is not easy to turn on the primary side power switch right at the valley of the quasi-resonant voltage because the delay contributed by the power switch and the main transformer, being unknown and dependent on the application, has to be taken into account in determining the turn-on instance of the primary side power switch.

Figure 2A:
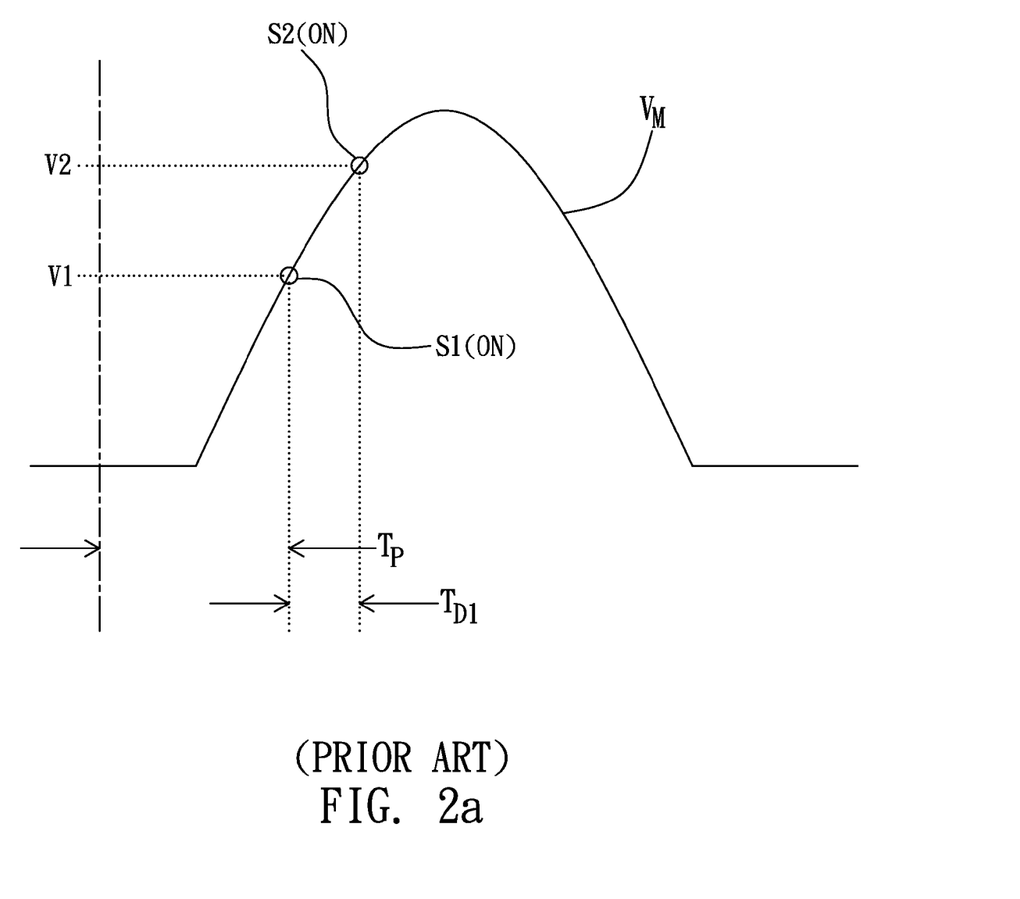
FIGS. 2a-2c shows the waveform for detecting the valley voltage and phase lock according to a prior art switching control circuit for a fly-back AC-to-DC power converter.
Figure 2B:
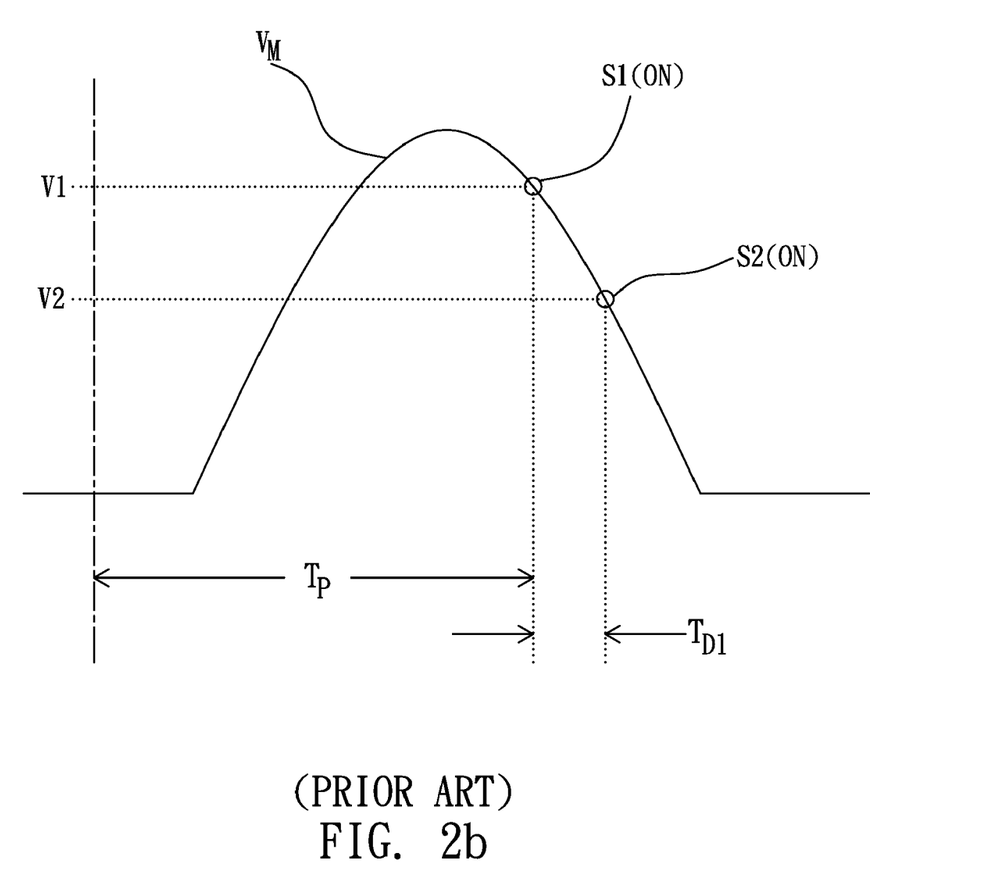
Figure 2C:
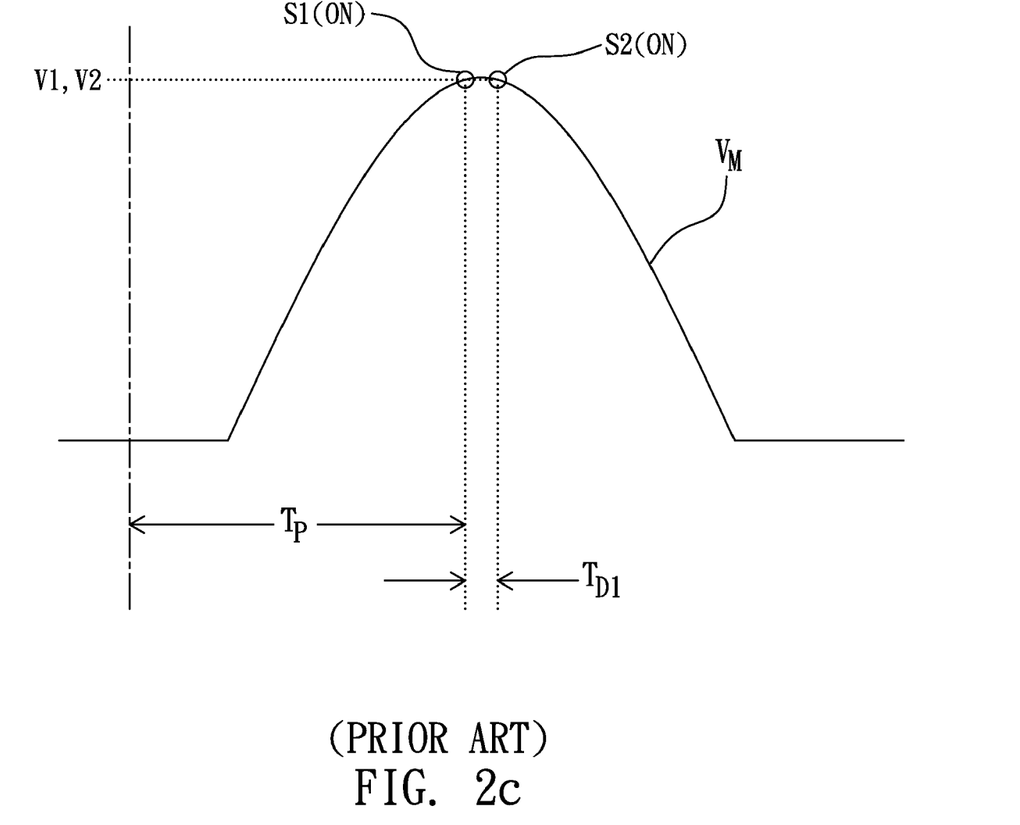

According to this problem, a prior art U.S. Pat. No. 7,426,120 B2 has proposed a switching control circuit. Please refer to FIG. 2a-2c, which shows the waveform for detecting the valley voltage and phase lock according to the prior art switching control circuit for a fly-back AC-to-DC power converter. As shown in FIG. 2a-2c, the $V_M$ is an inverted version of a voltage from an auxiliary winding, and the prior circuit needs two sets of sampling circuit and related processing circuit to accomplish the soft switching. Due to the complex circuit structure, the prior art U.S. Pat. No. 7,426,120 B2 is not robust enough in implementing power converters, so there is a need of a concise and robust solution for soft switching the primary side power switch.

SUMMARY OF THE INVENTION

One objective of the present invention is to provide a novel quasi-resonant valley voltage detecting method for a switching power converter to soft switching a primary side power switch in a robust way.

Another objective of the present invention is to further provide a quasi-resonant valley voltage detecting apparatus with concise architecture, for a switching power converter to soft switching a primary side power switch in a robust way.

To achieve the foregoing objectives of the present invention, a quasi-resonant valley voltage detecting method is proposed, the method comprising the steps of: generating a valley detection signal by detecting a valley of a first quasi-resonant signal; generating a count value by counting the valley detection signal; and determining a level transition instance of a gating signal according to the count value, wherein the level transition instance of the gating signal is pulled back by the valley detection signal to trace the valley of the first quasi-resonant signal.

To achieve the foregoing objectives, the present invention further provides a quasi-resonant valley voltage detecting apparatus, comprising: a valley detector, used for generating a valley detection signal according to voltage comparison of a first quasi-resonant signal and a second quasi-resonant signal, wherein the second quasi-resonant signal is a delayed version of the first quasi-resonant signal; a counter unit, used for generating a count value according to a counting of the valley detection signal; a delay unit, used for delaying a first set signal with a delay time to generate a second set signal, wherein the delay time is determined by the count value; a comparator, used for generating the first set signal according to the first quasi-resonant signal and a reference voltage; and a latch, used for generating a gating signal according to the second set signal and a reset signal.

To achieve the foregoing objectives, the present invention further provides a quasi-resonant valley voltage detecting apparatus, comprising: a valley detector, used for generating a valley detection signal according to voltage comparison of a first quasi-resonant signal and a second quasi-resonant signal, wherein the second quasi-resonant signal is a delayed version of the first quasi-resonant signal; a counter unit, used for generating a count value according to a counting of the valley detection signal; a digital to analog converter, used for generating an adjustable reference voltage according to the count value; a comparator, used for generating a set signal according to the first quasi-resonant signal and the adjustable reference voltage; and a latch, used for generating a gating signal according to the set signal and a reset signal.

To make it easier for our examiner to understand the objective of the invention, its structure, innovative features, and performance, we use preferred embodiments together with the accompanying drawings for the detailed description of the invention.

DETAILED DESCRIPTION OF THE PREFERRED EMBODIMENTS

The present invention will be described in more detail hereinafter with reference to the accompanying drawings that show the preferred embodiment of the invention.

Figure 3:
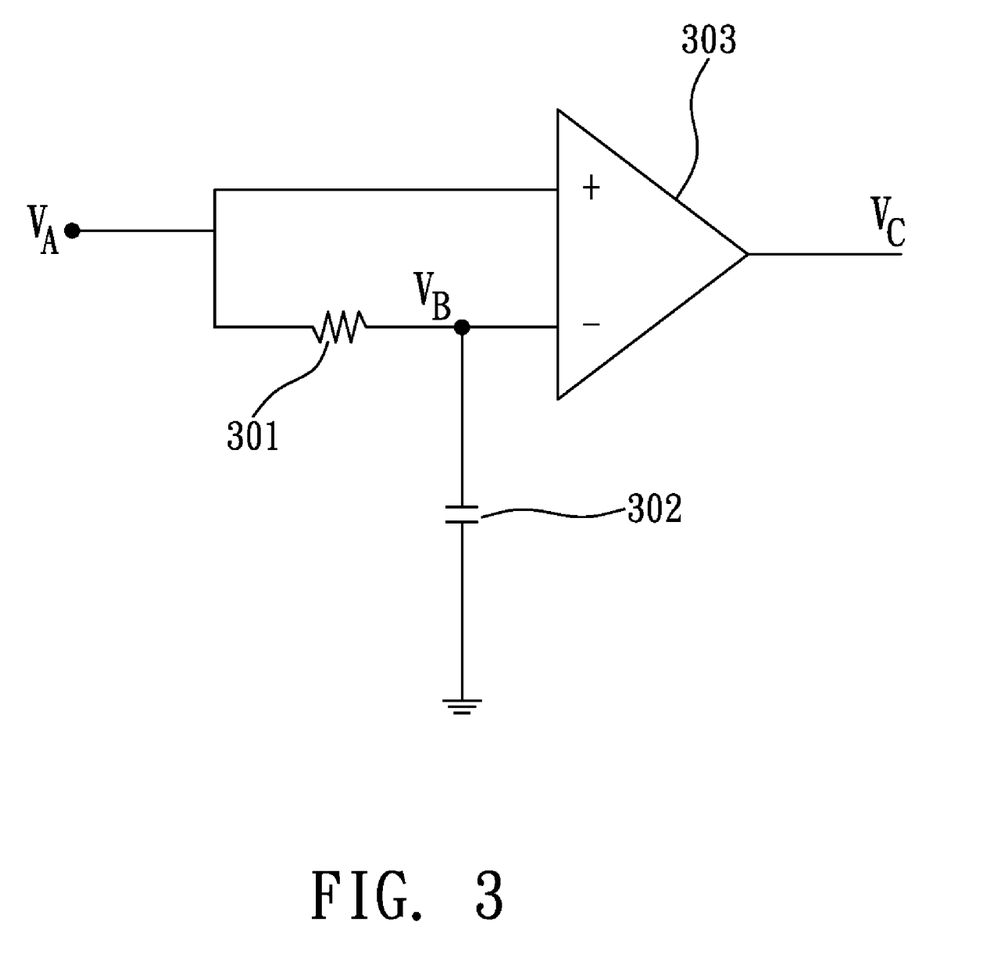
FIG. 3 is the circuit diagram of a valley voltage detecting circuit according to a preferred embodiment of the present invention.

Please refer to FIG. 3, which shows the circuit diagram of a valley voltage detecting circuit according to a preferred embodiment of the present invention. As shown in FIG. 3, the circuit according to a preferred embodiment of the present invention includes a resistor 301, a capacitor 302 and a comparator 303.

In the architecture, the resistor 301 and the capacitor 302 are used as a delay unit for delaying a first quasi-resonant signal $V_A$ to generate a second quasi-resonant signal $V_B$.

The comparator 303 is used to generate a valley detection step signal $V_C$ according to the first quasi-resonant signal $V_A$ and the second quasi-resonant signal $V_B$.

Figure 4A:
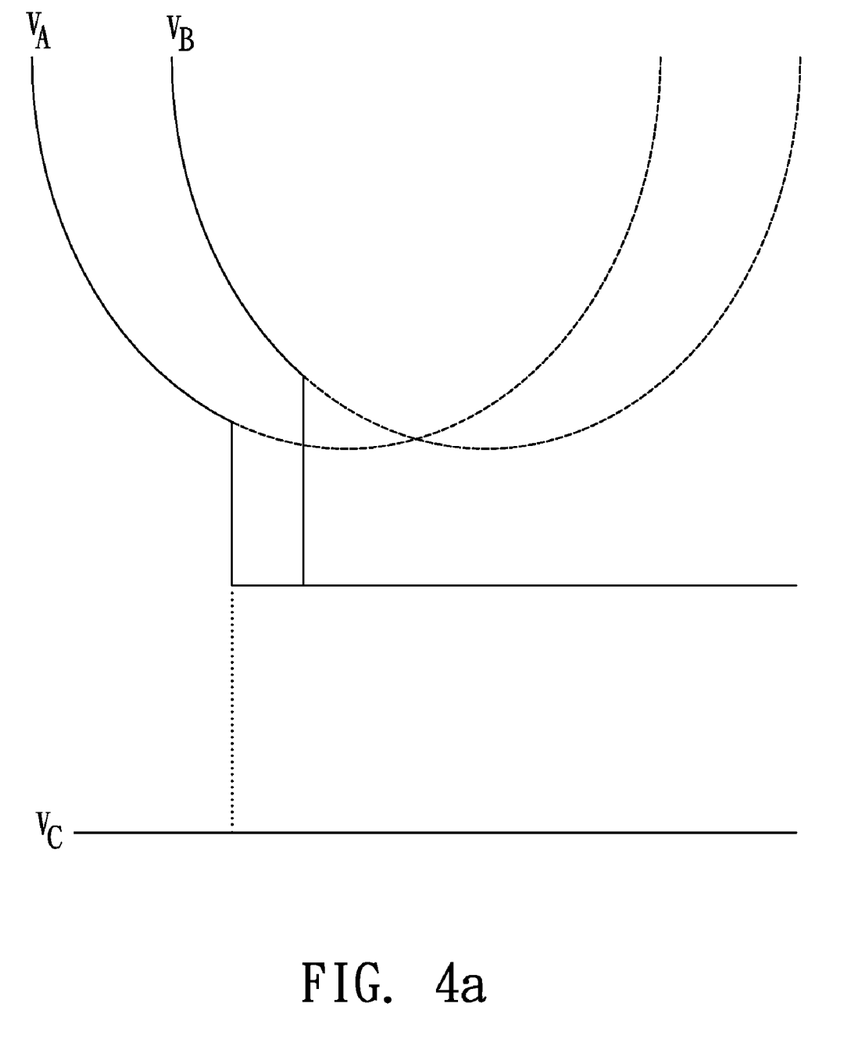
FIGS. 4a-4b shows the waveform for detecting the valley voltage according to the valley voltage detecting circuit in FIG. 3.
Figure 4B:
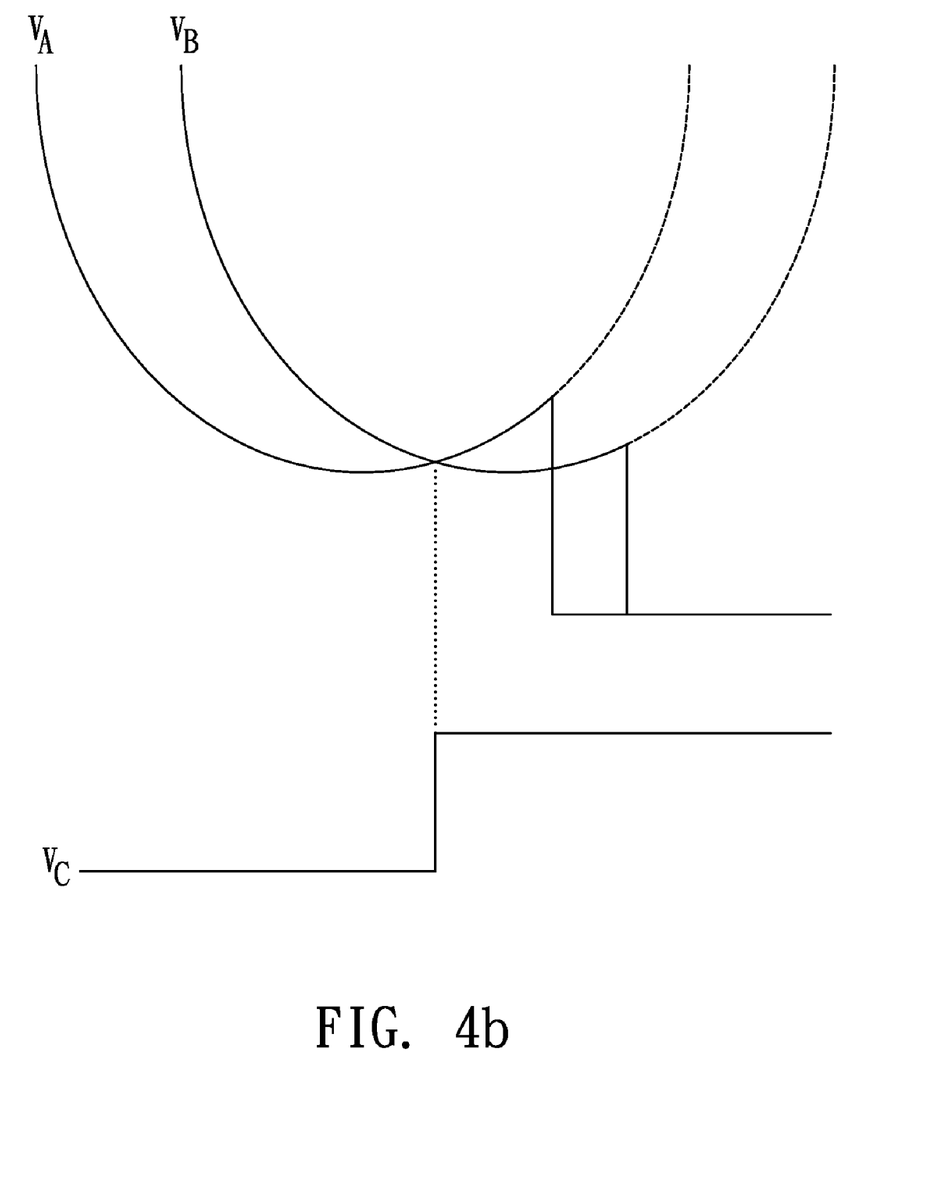

Please refer to FIG. 4a-4b, which shows the waveform for detecting the valley voltage according to the valley voltage detecting circuit in FIG. 3. When the primary side power switch (as the NMOS transistor 107 in FIG. 1) is turned on at a time before the first quasi-resonant signal $V_A$ reaches its valley, the resultant waveform of $V_A$, as shown in FIG. 4a, will be always lower than $V_B$, and the valley detection step signal $V_C$ will stay at a low level. When the primary side power switch (as the NMOS transistor 107 in FIG. 1) is turned on at a time after the first quasi-resonant signal $V_A$ has reached its valley, the resultant waveform of $V_A$, as shown in FIG. 4b, will be higher than $V_B$ after the cross over of $V_A$ and $V_B$, and the valley detection step signal $V_C$ will exhibit a low to high transition.

Figure 5:
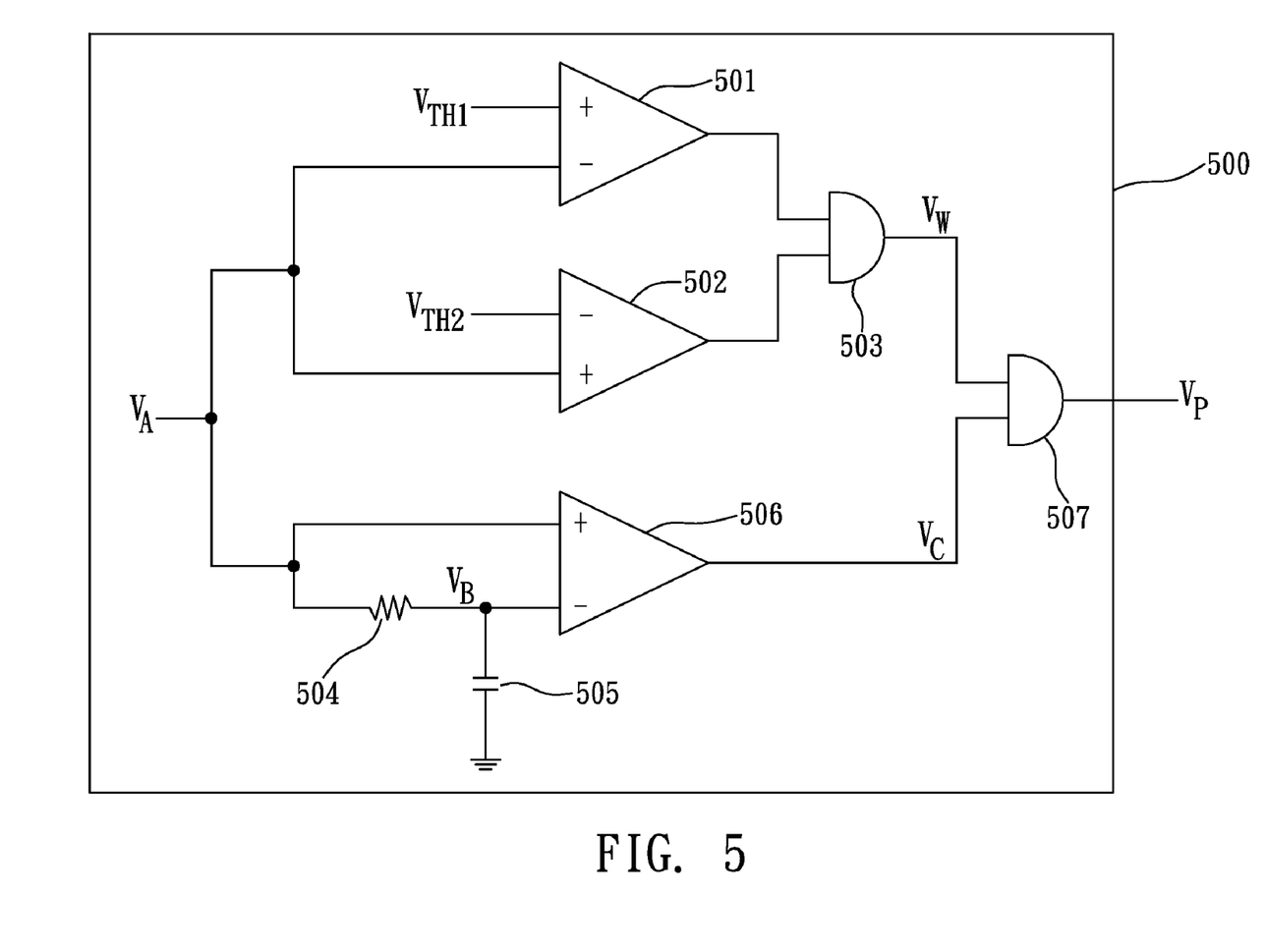
FIG. 5 is the circuit diagram of a valley voltage detector according to a preferred embodiment of the present invention.

According to the circuit in FIG. 3, the present invention further proposes a valley voltage detector capable of issuing a pulse when the cross over of $V_A$ and $V_B$ is present. Please refer to FIG. 5, which shows the circuit diagram of a valley voltage detector according to a preferred embodiment of the present invention. As shown in FIG. 5, the valley voltage detector 500 includes a comparator 501, a comparator 502, an AND gate 503, a resistor 504, a capacitor 505, a capacitor 506 and an AND gate 507.

The comparator 501 is used for generating a first step signal according to the first quasi-resonant signal $V_A$ and a first threshold voltage $V_{TH1}$.

The comparator 502 is used for generating a second step signal according to the first quasi-resonant signal $V_A$ and a second threshold voltage $V_{TH2}$.

The AND gate 503 is used for generating a window signal $V_W$ according to the first step signal and the second step signal.

The resistor 504 and the capacitor 505 are used as an RC delay circuit to generate a second quasi-resonant signal $V_B$ according to the first quasi-resonant signal $V_A$.

The comparator 506 is used for generating a valley detection step signal $V_C$ according to the first quasi-resonant signal $V_A$ and the second quasi-resonant signal $V_B$.

The AND gate 507 is used for generating a valley detection signal $V_P$ according to the window signal $V_W$ and the valley detection step signal $V_C$.

Figure 6:
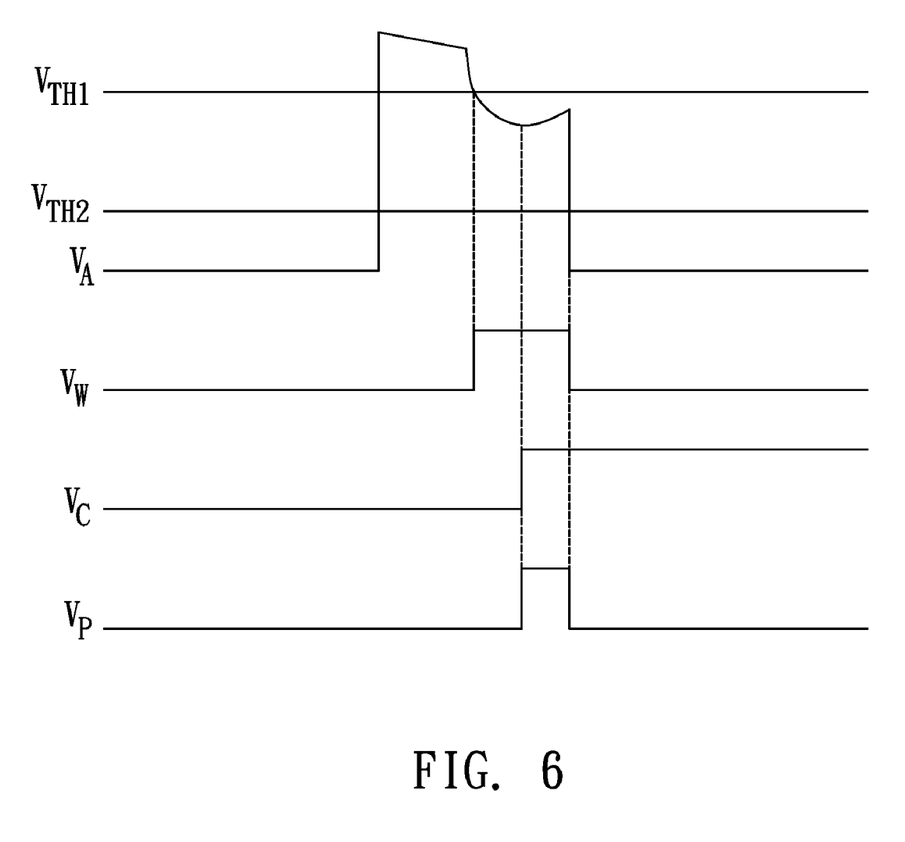
FIG. 6 shows the waveform for detecting the valley voltage according to the valley voltage detector in FIG. 5.

Please refer to FIG. 6, which shows the waveform for detecting the valley voltage according to the valley voltage detector 500 in FIG. 5. As shown in FIG. 6, the window signal $V_W$ is defined by the first threshold voltage $V_{TH1}$ and the second threshold voltage $V_{TH2}$. The valley detection step signal $V_C$ has a rising edge corresponding to the valley of the first quasi-resonant signal $V_A$, and the valley detection signal $V_P$ is generated by performing logic-AND operation on the valley detection step signal $V_C$ and the window signal $V_W$.

Figure 7:
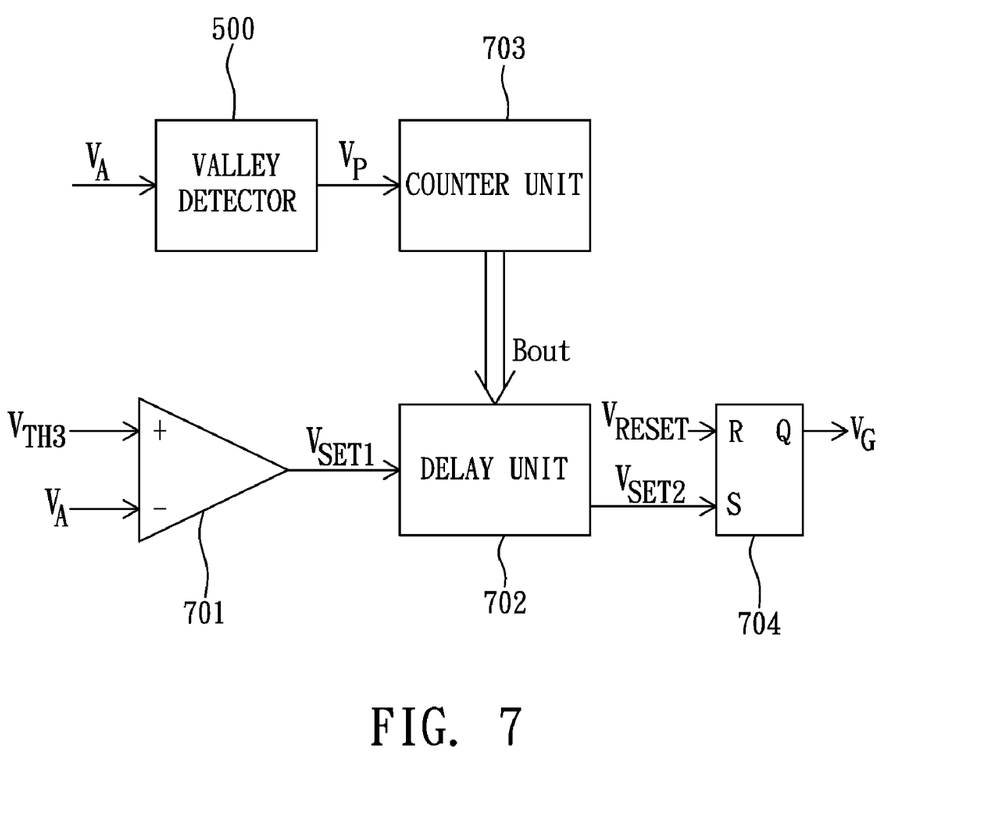
FIG. 7 is the block diagram of a soft switching controller according to a preferred embodiment of the present invention.

According to the valley voltage detector 500 in FIG. 5, the present invention further proposes a soft switching controller. Please refer to FIG. 7, which shows the block diagram of a soft switching controller according to a preferred embodiment of the present invention. As shown in FIG. 7, the soft switching controller includes a valley detector 500, a comparator 701, a delay unit 702, a counter unit 703 and a latch 704.

The valley detector 500, as specified above in FIG. 5, is used to generate a valley detection signal $V_P$ according to a quasi-resonant signal $V_A$.

The comparator 701 is used for generating a first set signal $V_{SET1}$ according to the quasi-resonant signal $V_A$ and a reference voltage $V_{TH3}$.

The delay unit 702 is used for delaying the first set signal $V_{SET1}$ with a delay time to generate a second set signal $V_{SET2}$, wherein the delay time is determined by a count value $B_{out}$.

The counter unit 703 is used for generating the count value $B_{out}$ according to a counting of the valley detection signal $V_P$.

The latch 704 is used for generating a gating signal $V_G$ according to the second set signal $V_{SET2}$ and a reset signal $V_{RESET}$, wherein the gating signal $V_G$ will issue a high level when the S input of the latch 704 is triggered by the second set signal $V_{SET2}$.

Through the implementation of the soft switching controller as shown in FIG. 7, the timing of the rising edge of the gating signal $V_G$ can be adjusted in a way that if the cross over is present then the delay time will be reduced to draw back the instance of the rising edge of the gating signal $V_G$, and the conduction loss of the primary side power switch is reduced to minimum.

Figure 8:
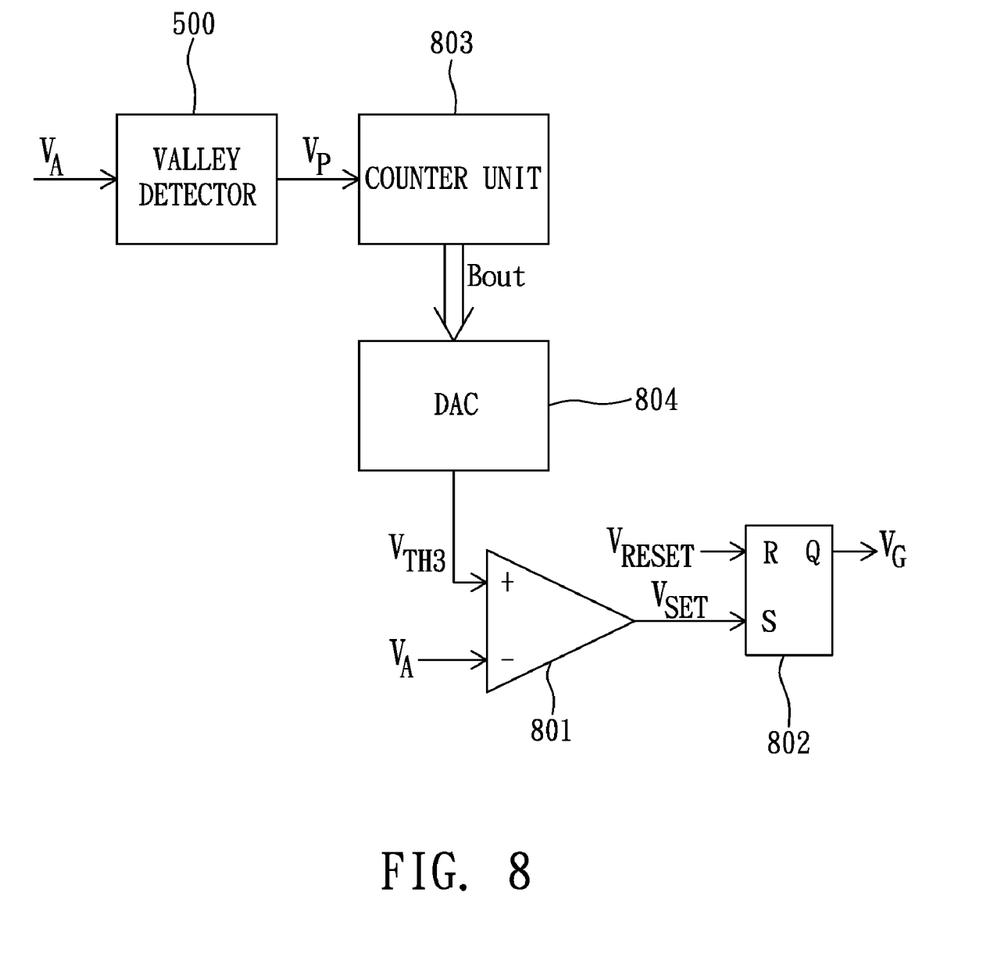
FIG. 8 is the block diagram of a soft switching controller according to another preferred embodiment of the present invention.

FIG. 8 shows the block diagram of a soft switching controller according to another preferred embodiment of the present invention. As shown in FIG. 8, the soft switching controller includes a valley detector 500, a comparator 801, a latch 802, a counter unit 803 and a digital to analog converter 804.

The valley detector 500, as specified above in FIG. 5, is used to generate a valley detection signal $V_P$ according to a quasi-resonant signal $V_A$.

The comparator 801 is used for generating a set signal $V_{SET}$ according to the quasi-resonant signal $V_A$ and an adjustable reference voltage $V_{TH4}$.

The latch 802 is used for generating a gating signal $V_G$ according to the set signal $V_{SET}$ and a reset signal $V_{RESET}$.

The counter unit 803 is used for generating the count value $B_{out}$ according to a counting of the valley detection signal $V_P$.

The digital to analog converter 804 is used for generating an adjustable reference voltage $V_{TH4}$ according to the count value $B_{out}$.

Through the implementation of the soft switching controller as shown in FIG. 8, the timing of the rising edge of the gating signal $V_G$ can be adjusted in a way that if the cross over is present then the adjustable reference voltage $V_{TH4}$ will be increased to draw back the instance of the rising edge of the gating signal $V_G$, and the conduction loss of the primary side power switch is reduced to minimum.

Figure 9:
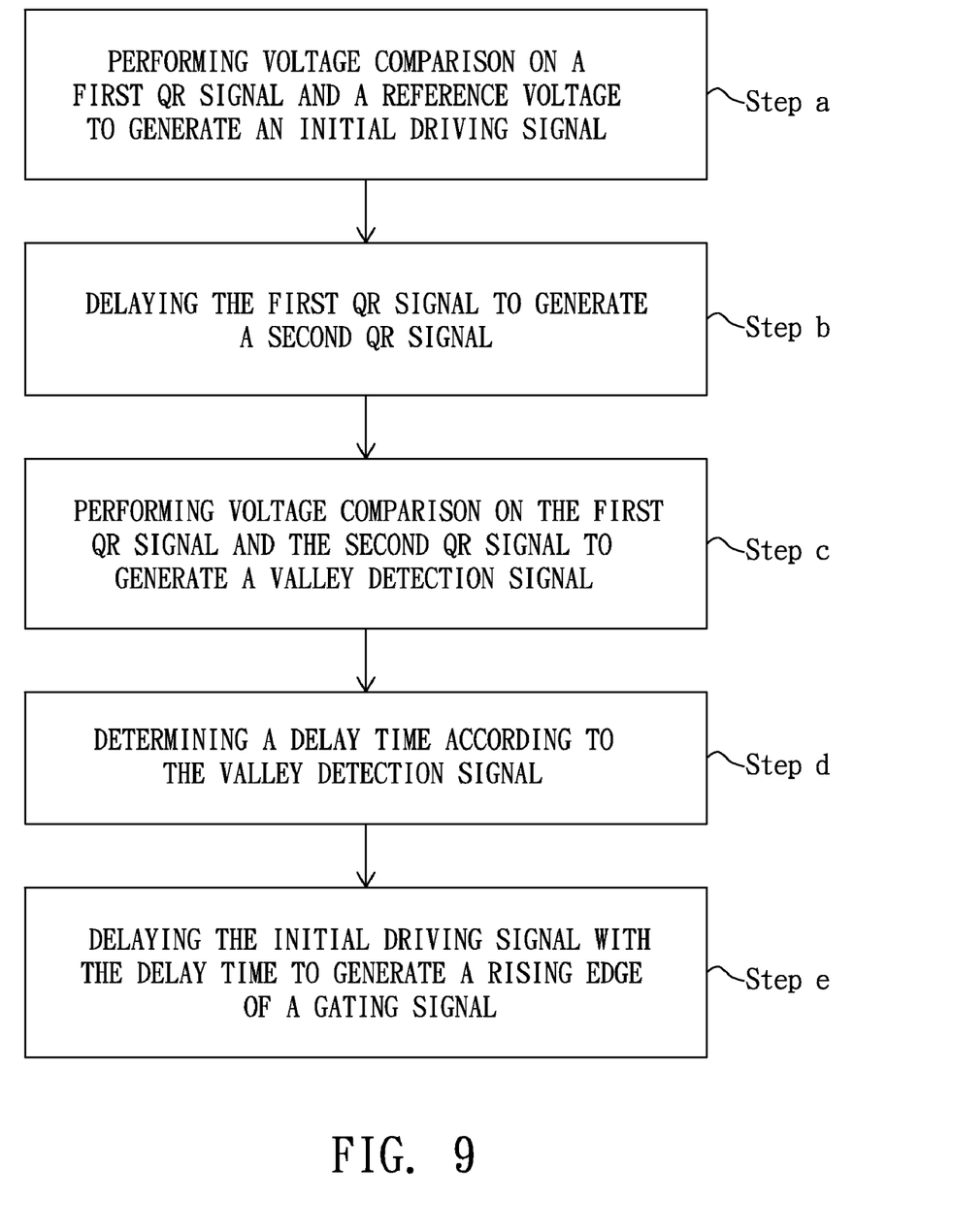
FIG. 9 is the flow chart of a soft switching method according to a preferred embodiment of the present invention.

According to the apparatus in FIG. 7, the present invention further proposes a quasi-resonant valley voltage detection method. Please refer to FIG. 9, which shows the flow chart of a soft switching method according to a preferred embodiment of the present invention. As shown in FIG. 9, the method includes the steps of: performing voltage comparison on a first quasi-resonant signal and a reference voltage to generate an initial driving signal (step a); delaying the first quasi-resonant signal to generate a second quasi-resonant signal (step b); performing voltage comparison on the first quasi-resonant signal and the second quasi-resonant signal to generate a valley detection signal (step c); determining a delay time according to the valley detection signal (step d); and delaying the initial driving signal with the delay time to generate a rising edge of a gating signal (step e).

In step a, the initial driving signal is for presetting a turn-on instance of the primary side power switch.

In step b, the first quasi-resonant signal and the second quasi-resonant signal will have a cross over if the primary side power switch is turned on after the valley of the first quasi-resonant signal has appeared.

In step c, the valley detection signal will issue a pulse if the cross over in step b is present.

In step d, the delay time is adjusted in a way that when the valley detection signal issues a pulse, the delay time is decreased by a predetermined value.

In step e, the instance of the rising edge of the gating signal is adjusted by the delay time to meet the valley of the first quasi-resonant signal in a negative feedback manner. If the cross over is present then the delay time will be reduced to draw back the instance of the rising edge of the gating signal $V_G$, and the conduction loss of the primary side power switch is reduced to minimum.

Figure 10:
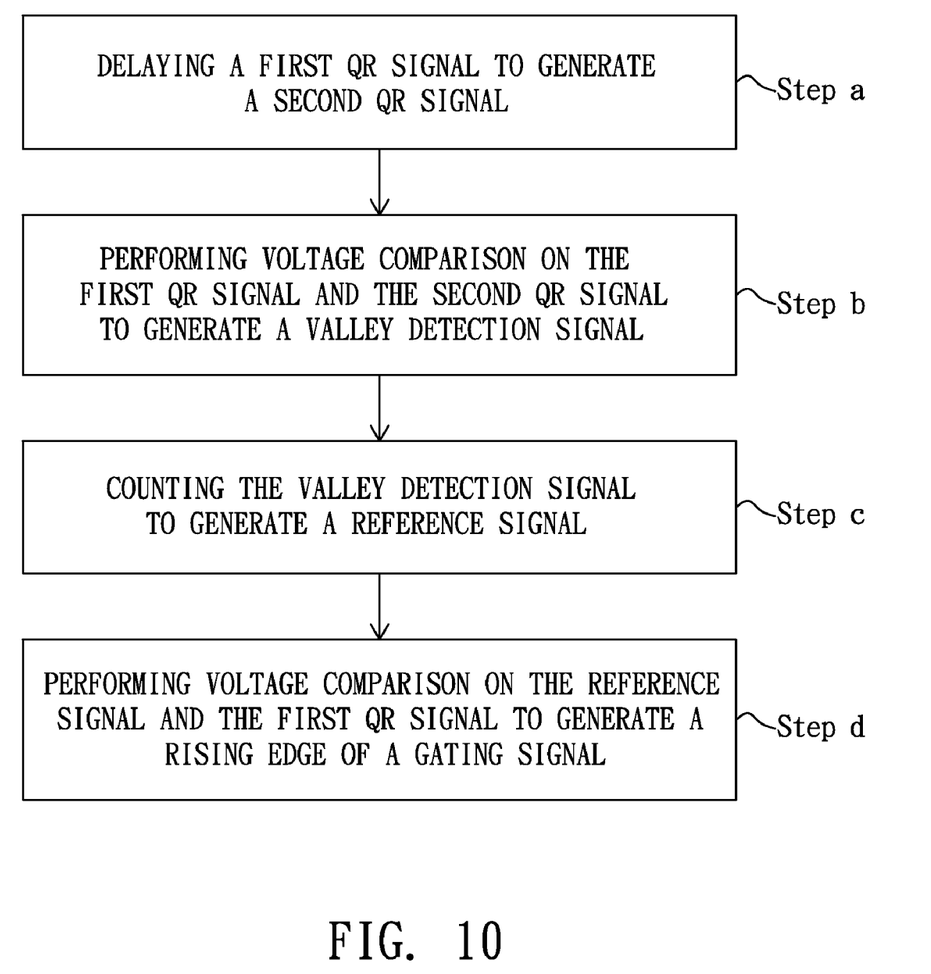
FIG. 10 is the flow chart of a soft switching method according to another preferred embodiment of the present invention.

According to the apparatus in FIG. 8, the present invention further proposes a quasi-resonant valley voltage detection method. Please refer to FIG. 10, which shows the flow chart of a soft switching method according to another preferred embodiment of the present invention. As shown in FIG. 10, the method includes the steps of: delaying a first quasi-resonant signal to generate a second quasi-resonant signal (step a); performing voltage comparison on the first quasi-resonant signal and the second quasi-resonant signal to generate a valley detection signal (step b); counting the valley detection signal to generate a reference signal (step c); and performing voltage comparison on the reference signal and the first quasi-resonant signal to generate a rising edge of a gating signal (step d).

In step a, the first quasi-resonant signal and the second quasi-resonant signal will have a cross over if the primary side power switch is turned on after the valley of the first quasi-resonant signal has appeared.

In step b, the valley detection signal will issue a pulse if the cross over in step b is present.

In step c, the reference voltage is adjusted in a way that when the valley detection signal issues a pulse, the reference voltage is increased by a predetermined value.

In step d, the instance of the rising edge of the gating signal is adjusted by the reference voltage to meet the valley of the first quasi-resonant signal in a negative feedback manner.

Through the implementation of the present invention, a more concise architecture in soft switching for power module applications is achieved. The cross over concept and the digital adjustment manner according to the present invention, having superior performance in locating the valley of a quasi-resonant voltage, have created a novel and robust way of soft switching the primary side power switch in power converter applications.

While the invention has been described by way of example and in terms of preferred embodiments, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

In summation of the above description, the present invention herein enhances the performance than the conventional structure and further complies with the patent application requirements and is submitted to the Patent and Trademark Office for review and granting of the commensurate patent rights.

What is claimed is:

1. A quasi-resonant valley voltage detecting method, comprising the steps of:
   generating a valley detection signal by detecting a valley of a first quasi-resonant signal;
   generating a count value by counting said valley detection signal; and
   determining a level transition instance of a gating signal according to said count value, wherein said level transition instance of said gating signal is pulled back by said valley detection signal to trace said valley of said first quasi-resonant signal.

2. The method according to claim 1, wherein said valley detection signal is generated by:
   delaying said first quasi-resonant signal with a delay circuit to generate a second quasi-resonant signal;
   performing voltage comparison on said first quasi-resonant signal and said second quasi-resonant signal to generate said valley detection signal.

3. The method according to claim 2, wherein said delay circuit is an RC delay circuit.

4. The method according to claim 1, wherein said level transition instance of said gating signal is generated by delaying an initial driving signal with a delay time, wherein said initial driving signal is generated by performing voltage comparison on said first quasi-resonant signal and a first reference voltage, and said delay time is determined according to said count value of said valley detection signal.

5. The method according to claim 1, wherein said level transition instance of said gating signal is generated by performing voltage comparison on said first quasi-resonant signal and a second reference signal, wherein said second reference signal is generated according to said count value of said valley detection signal.

6. A quasi-resonant valley voltage detecting apparatus, comprising:
- a valley detector, used for generating a valley detection signal according to voltage comparison of a first quasi-resonant signal and a second quasi-resonant signal, wherein said second quasi-resonant signal is a delayed version of said first quasi-resonant signal;
- a counter unit, used for generating a count value according to a counting of said valley detection signal;
- a delay unit, used for delaying a first set signal with a delay time to generate a second set signal, wherein said delay time is determined by said count value;
- a comparator, used for generating said first set signal according to said first quasi-resonant signal and a reference voltage; and
- a latch, used for generating a gating signal according to said second set signal and a reset signal.

7. The apparatus according to claim 6, wherein said valley detector comprises:
- a first comparator, used for generating a first step signal according to said first quasi-resonant signal and a first threshold voltage;
- a second comparator, used for generating a second step signal according to said first quasi-resonant signal and a second threshold voltage;
- a first AND gate, used for generating a window signal according to said first step signal and said second step signal;
- an RC delay circuit, used for generating said second quasi-resonant signal according to said first quasi-resonant signal;
- a third comparator, used for generating a valley detection step signal according to said first quasi-resonant signal and said second quasi-resonant signal; and
- a second AND gate, used for generating said valley detection signal according to said window signal and said valley detection step signal.

8. A quasi-resonant valley voltage detecting apparatus, comprising:
- a valley detector, used for generating a valley detection signal according to voltage comparison of a first quasi-resonant signal and a second quasi-resonant signal, wherein said second quasi-resonant signal is a delayed version of said first quasi-resonant signal;
- a counter unit, used for generating a count value according to a counting of said valley detection signal;
- a digital to analog converter, used for generating an adjustable reference voltage according to said count value;
- a comparator, used for generating a set signal according to said first quasi-resonant signal and said adjustable reference voltage; and
- a latch, used for generating a gating signal according to said set signal and a reset signal.

9. The apparatus according to claim 8, wherein said valley detector comprises:
- a first comparator, used for generating a first step signal according to said first quasi-resonant signal and a first threshold voltage;
- a second comparator, used for generating a second step signal according to said first quasi-resonant signal and a second threshold voltage;
- a first AND gate, used for generating a window signal according to said first step signal and said second step signal;
- an RC delay circuit, used for generating said second quasi-resonant signal according to said first quasi-resonant signal;
- a third comparator, used for generating a valley detection step signal according to said first quasi-resonant signal and said second quasi-resonant signal; and
- a second AND gate, used for generating said valley detection signal according to aid window signal and said valley detection step signal.

* * * * *